United States Patent
Christodoulides et al.

(10) Patent No.: US 9,979,160 B2
(45) Date of Patent: May 22, 2018

(54) INTEGRATED OPTICAL CIRCULATOR APPARATUS, METHOD, AND APPLICATIONS

(71) Applicant: UNIVERSITY OF CENTRAL FLORIDA RESEARCH FOUNDATION, INC., Orlando, FL (US)

(72) Inventors: Demetrios Christodoulides, Orlando, FL (US); Patrick L. LiKamWa, Orlando, FL (US); Parinaz Aleahmad, Orlando, FL (US); Ramy El-Ganainy, Orlando, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 0 days. days.

(21) Appl. No.: 15/627,964

(22) Filed: Jun. 20, 2017

(65) Prior Publication Data

US 2017/0365983 A1    Dec. 21, 2017

Related U.S. Application Data

(60) Provisional application No. 62/352,218, filed on Jun. 20, 2016.

(51) Int. Cl.
| | |
|---|---|
| H01S 5/026 | (2006.01) |
| H01S 5/343 | (2006.01) |
| H01S 5/10 | (2006.01) |
| H01S 5/30 | (2006.01) |
| H01S 5/50 | (2006.01) |

(Continued)

(52) U.S. Cl.
CPC ......... *H01S 5/34326* (2013.01); *H01S 5/026* (2013.01); *H01S 5/1003* (2013.01); *H01S 5/22* (2013.01); *H01S 5/3054* (2013.01); *H01S 5/5063* (2013.01); *G02B 6/2746* (2013.01)

(58) Field of Classification Search
CPC ..... H01S 5/026; H01S 5/1003; G02B 6/2746; G02B 2006/12157
See application file for complete search history.

(56) References Cited

U.S. PATENT DOCUMENTS

| 9,164,350 B2 * | 10/2015 | He | G02F 1/0955 |
| 2009/0023237 A1 * | 1/2009 | Mizumoto | G02B 6/122 |
| | | | 438/31 |

* cited by examiner

*Primary Examiner* — Michael Carter
(74) *Attorney, Agent, or Firm* — Bond, Schoeneck & King, PLLC; William Greener

(57) ABSTRACT

An optical circulator is a device that routes optical pulses from port to port in a predetermined manner, e.g. in a 3-port optical circulator, optical pulses entering port 1 are routed out of port 2, while optical pulses entering port 2 exit out of port 3 and optical pulses fed into port 3 exit out of port 3. Currently such an optical circulator is made of discrete components such as magnetooptic garnets, rare-earth magnets and optical polarizers that are packaged together with fiber optic elements. Disclosed herein is a different kind of optical circulator that is monolithically integrated on a single semiconductor substrate and that is applicable for the routing of optical pulses. The embodied invention will enable photonic integrated circuits to incorporate on-chip optical circulator functionality thereby allowing much more complex optical designs to be implemented monolithically.

9 Claims, 5 Drawing Sheets

(51) Int. Cl.
*H01S 5/22* (2006.01)
*G02B 6/27* (2006.01)

FIG. 4A
FIG. 4B
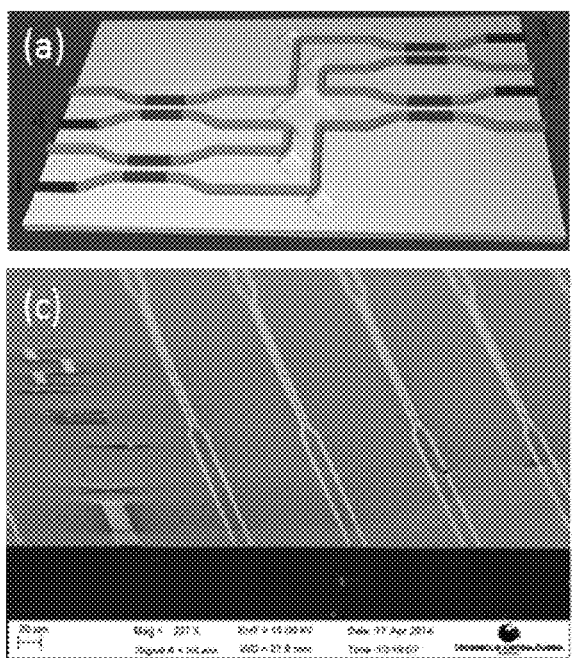
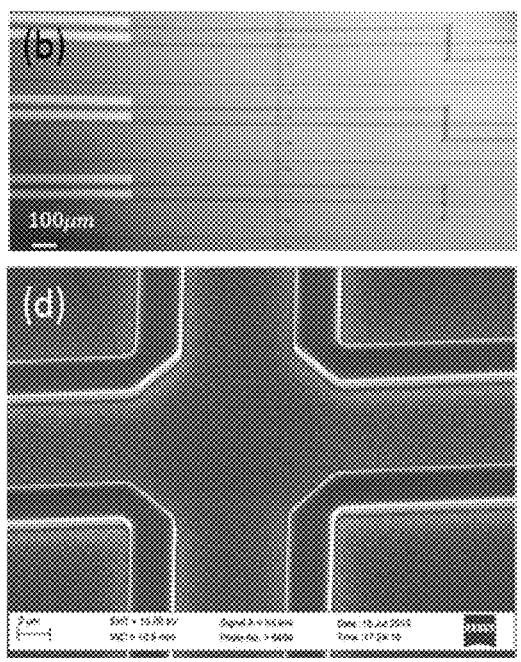
FIG. 4C
FIG. 4D
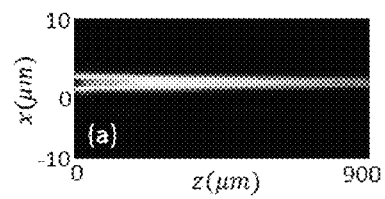
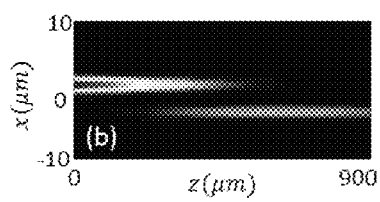
FIG. 5A
FIG. 5B

INTEGRATED OPTICAL CIRCULATOR APPARATUS, METHOD, AND APPLICATIONS

RELATED APPLICATION DATA

The instant application claims priority to U.S. provisional application Ser. No. 62/352,218 filed Jun. 20, 2016, the subject matter of which is incorporated by reference herein in its entirety.

FEDERAL FUNDING

This invention was made with Government support under MURI Grant #FA9550-14-1-0037 awarded by the Air Force Office of Scientific Research. The U.S. government has certain rights in this invention.

BACKGROUND

Aspects and embodiments of the invention most generally pertain to an optical component capable of manipulating a light input in a desired manner; more particularly to an optical circulator and, most particularly to a monolithically integrated semiconductor optical circulator with multiple optical ports that is capable of routing optical pulses directionally from port to port with better than 20 dB of isolation for the flow of optical pulses in the reverse direction, associated methods, and applications.

The integration of critical optical components on a single chip has been an ongoing quest in both optoelectronics and optical communication systems. Among the possible devices, elements supporting non-reciprocal transmission are of great interest for applications where signal routing and isolation is required. In this regard, breaking reciprocity is typically accomplished via Faraday rotation through appropriate magneto-optical arrangements. Unfortunately, standard light emitting optoelectronic materials, for example III-V semiconductors, lack magneto-optical properties and hence cannot be directly used in this capacity. To address these issues, a number of different tactics have been attempted in the last few years. These range from directly bonding garnets on chip, to parametric structures and unidirectional nonlinear arrangements involving ring resonators.

Optical circulators—devices capable of routing signals in a unidirectional fashion between their successive ports—play a crucial role in photonic networks. Such non-reciprocal devices typically involve magneto-optical garnets in conjunction with permanent magnets to provide isolation. However, in most photonic on-chip settings the bonding of garnets and the integration of magnets, though possible, is not readily conducive. In addition, these arrangements either the trade-off between a large foot-print and device bandwidth. Moreover, these approaches, due to the excessive losses, have provided only a limited degree of isolation.

In view of the foregoing and other shortcomings recognized by those skilled in the art, the inventors have recognized the benefits and advantages of enabled non-reciprocal devises that not only can be miniaturized and readily integrated on chip but that also rely on physical processes that are indigenous to the semiconductor wafer itself. According to the embodied invention, such unidirectional systems can be implemented by simultaneously exploiting the presence of gain/loss processes and optical nonlinearities. In principle, these all-dielectric structures can be broadband, polarization insensitive, color-preserving, and can display appreciable isolation ratios under pulsed conditions.

SUMMARY

An aspect of the invention is an optical circulator. In an embodiment, the optical circulator is a monolithically-integrated photonic circulator that includes a semiconductor substrate; a plurality of monolithlically-integrated input/output optical waveguides disposed in the substrate; a respective plurality of optical gain regions in the input/output optical waveguides; a respective plurality of non-Hermitian coupled waveguide regions disposed in the substrate optically coupled to respective ones of the input/output optical waveguides; a respective plurality of passive optical waveguides interconnecting the plurality of input/output waveguides disposed in the substrate; and a respective plurality of beam dumps. In various non-limiting, exemplary embodiments the optical circulator may include one or more of the following components, configurations, limitations, elements, alone or in various combinations as one skilled in the art would understand:
  comprising an n×n input/output ports optical circulator, where n is equal to or greater than 2;
  wherein each of the optical gain regions is a semiconductor optical amplifier (SOA);
  wherein each consecutive input/output port is oriented parallel to its preceding port;
  wherein the optical waveguides are monomode ridge waveguides;
  wherein the semiconductor substrate is InP;
    wherein the optical gain regions comprise an undoped InGaAsP multiple quantum well (MQW) core layer sandwiched between a p-doped InP cladding layer on the top and an n-doped InP cladding layer on the bottom disposed on the InP substrate, a conductive contact stripe disposed over the p-doped InP cladding layer, and a cathode contact layer disposed on the back of the substrate;
    wherein the MQW regions of the passive optical waveguides have a higher bandgap energy than the MQW regions of other waveguide regions such that the passive optical waveguides are characterized by a low loss propagation;
  wherein the non-Hermitian coupled waveguide regions comprise two parallelly disposed waveguides separated by a gap, characterized in that for a below threshold optical intensity signal the coupled waveguide region acts as a cross coupler, whereas for an above threshold optical intensity signal the coupled waveguide region behaves as a straight-through connector.

BRIEF DESCRIPTION OF THE DRAWINGS

FIG. 4A) Schematic view of a parallel 4-port circulator device; FIG. 4B) Microscopic view of a fully integrated active InP circulator; FIG. 4C) and FIG. 4D) SEM pictures of a fabricated system having a footprint of 4 mm×120 µm, according to an exemplary embodiment of the invention.

FIGS. 5A-5B: Intensity switching as obtained from beam-propagation simulations for FIG. 5A a high intensity pulsed beam (after amplification) in the first leg of the circulator of FIG. 4A, and FIG. 5B a low intensity beam in the absence of gain, as needed for the second segment before port 2, according to an illustrative embodiment of the invention.

DETAILED DESCRIPTION OF NON-LIMITING, EXEMPLARY EMBODIMENTS

A 4-port optical circulator is configured using four (4) all-optical switches and four semiconductor optical amplifiers all monolithically integrated on a single semiconductor substrate. The design incorporates a single multilayered structure of hetero-semiconductor materials including multiple quantum wells (MQW) core region.

Figure 1:
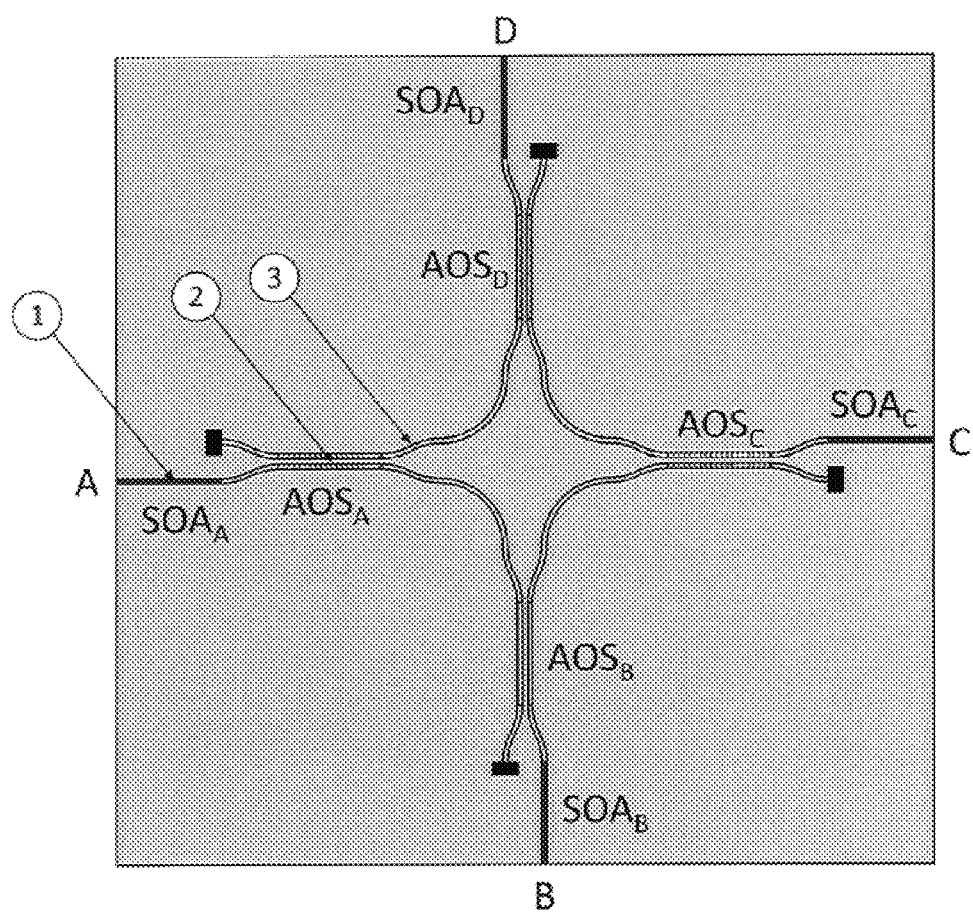
FIG. 1 schematically shows an integrated 4-port photonic circulator where each consecutive port is oriented perpendicular to its preceding port, according to an exemplary embodiment of the invention.

A schematic diagram of an integrated 4-port photonic circulator is shown in FIG. 1, where each consecutive port is oriented perpendicular to its preceding port, and in FIG. 4A, where port 1 and port 2 are oriented in parallel. Referring to FIG. 1, the main operational components of each port of the circulator include a semiconductor optical amplifier ($SOA_N$) 1, lossy all-optical switch ($AOS_N$) 2, and passive optical waveguide 3. Monomode ridge optical waveguides 3 form the interconnecting links between the SOAs 1 and all-optical switches 2. The terminal black boxes represent dumps.

Figure 2:
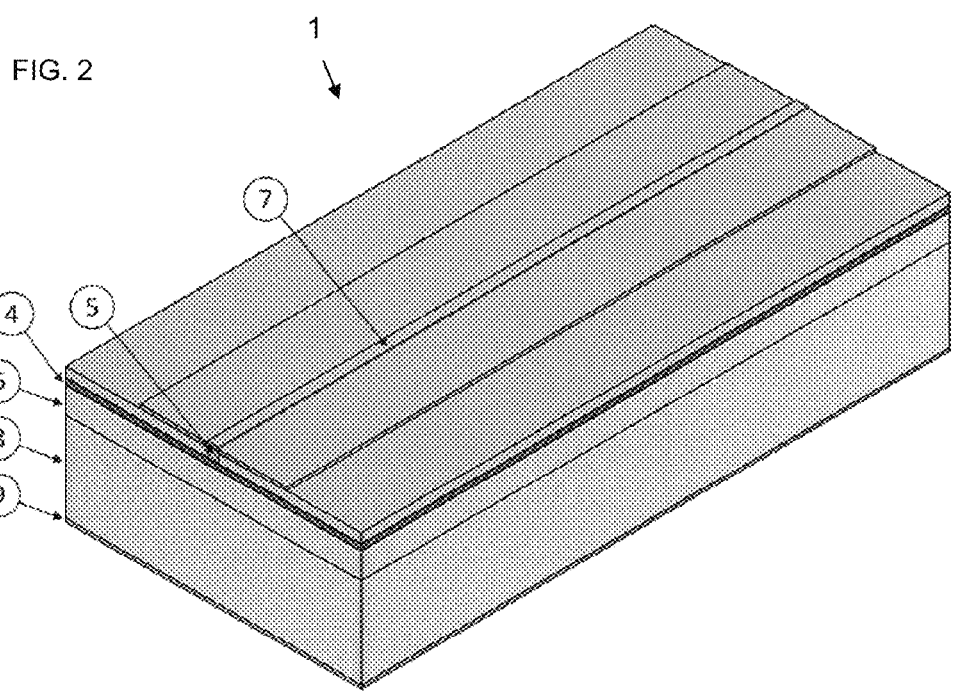
FIG. 2 shows a schematic perspective cross sectional view of the semiconductor optical amplifier section of the photonic circulator, according to an exemplary embodiment of the invention.

FIG. 2 shows a schematic perspective cross sectional view of the semiconductor optical amplifier section 1 of the device. The semiconductor structure 1 is a standard double heterojunction laser diode configuration, which consists of an undoped InGaAsP MQW core layer 4 sandwiched between p-doped InP cladding layer 5 on the top and n-doped InP cladding layer 6 on the bottom. Electrical current is injected via a gold contact stripe 7. The entire p-i-n structure is grown on an n-doped InP substrate 8. A Ni/Ge/Au layer 9 is deposited on the back of the substrate 8 to form a cathode contact. When electrical current is injected through the contact stripe 7, electrons accumulate in the active area and provide amplification to optical pulses passing through the MQW core layer 4 underneath the stripe.

Figure 3A:
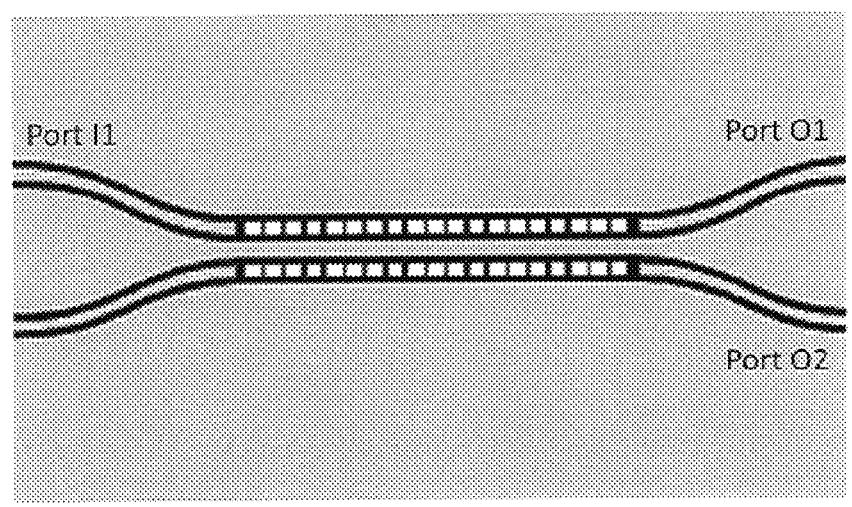
FIG. 3A schematically shows a cross sectional view, and FIG. 3B a schematic representation of the coupler section, in the form of an all-optical switch (AOS), according to an exemplary embodiment of the invention.
Figure 3B:
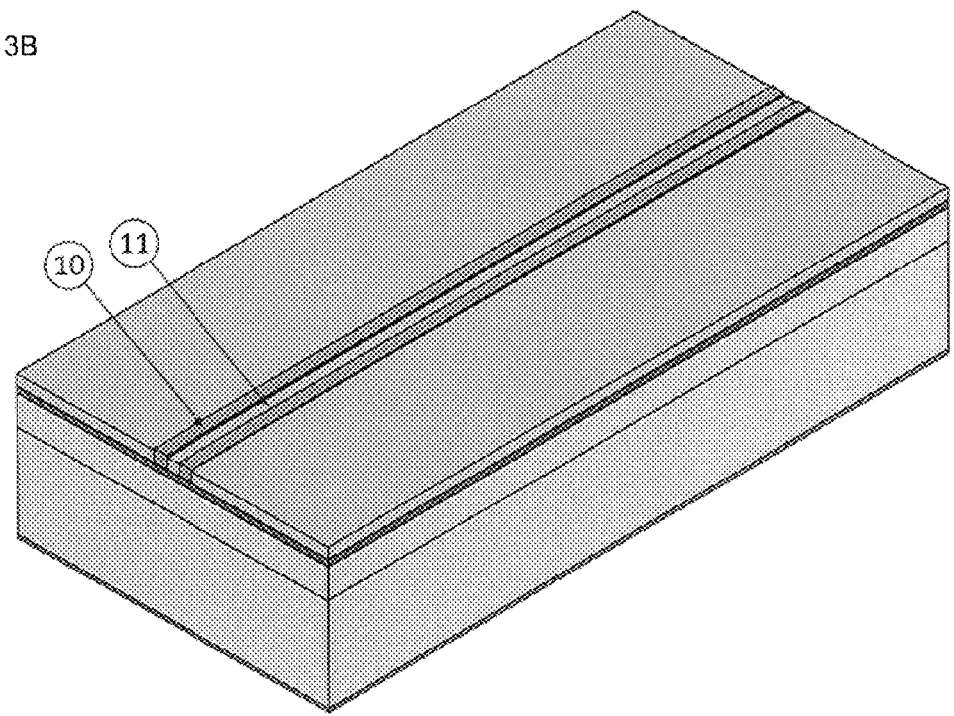

FIG. 3A shows a cross sectional view and FIG. 3B a schematic representation of the all-optical switch section 2. It consists of the same semiconductor structure as in the rest of the device. In this section two co-propagating ridge optical waveguides 10 are placed parallel to each other with a separating gap 11 of 2 um±10%. For low (e.g., 1 mW) optical intensity signals the all-optical switch 2 acts as a cross coupler and routes them from input port I1 to output port O2, whereas for high (e.g., 10 dB gain; 10 mW) optical intensity signals the all-optical switch 2 behaves as a straight-through connector and routes them from input port I1 to output port O1.

The passive optical waveguides 3 (FIG. 1) operate as low loss optical connectors and are formed in the same semiconductor structure as the semiconductor amplifier and the all-optical switch. However, the MQW core layer has been altered in such a way that in these regions containing the passive optical waveguides the bandgap energy is significantly higher (1400 nm) than in the other regions (1550 nm) to ensure low loss propagation.

The operation of the device is as follows. A pulsed optical signal entering port A is amplified by the $SOA_A$. Due to the high intensity of the pulse it passes straight-through the first all-optical switch $AOS_A$ and is attenuated to a low intensity signal. The low intensity optical signal passes through the second all-optical switch $AOS_B$ and is cross-routed to port B after being amplified to the initial input power level by $SOA_B$. Any remnants of the input signal that is routed to $AOS_D$ is of low intensity and therefore is cross-routed to the dump port of $AOS_D$ where the signal is completely attenuated and no signal appears at port D.

Similarly, optical pulse signals entering port B are amplified by $SOA_B$, and as high intensity pulses pass straight-through the all-optical switch $AOS_B$ where they are attenuated and become low intensity signals. The low intensity optical signals passing through the all-optical switch $AOS_C$ are cross routed to output port C after being amplified to the initial input power levels by $SOA_C$. Any remnants of the input signals that are routed to $AOS_A$ are of low intensity and therefore are cross-routed to the dump port of $AOS_A$ and no signal appears at port A.

Likewise, optical pulse signals entering port C are amplified by $SOA_C$ and pass straight through the all-optical switch $AOS_C$ and become low intensity signals that are cross-routed through the all-optical switch $AOS_D$ to output port D after being amplified to the initial input power levels by $SOA_D$. Any remnants of the input signals that are routed to $AOS_B$ are of low intensity and therefore are cross-routed to the dump port of $AOS_B$ and no signal appears at port B.

Likewise, optical pulse signals entering port D are amplified by $SOA_D$ and pass straight through the all-optical switch $AOS_D$ and become low intensity signals that are cross-routed through the all-optical switch $AOS_A$ to output port A after being amplified to the initial input power levels by $SOA_A$. Any remnants of the input signals that are routed to $AOS_C$ are of low intensity and therefore are cross-routed to the dump port of $AOS_C$ and no signal appears at port C.

With reference to FIGS. 4A-4D, FIG. 4A shows a schematic view of an all-dielectric 4×4 circulator design on InP meant for 1550 nm. The darkened end segments (1, 4, 3,2) depict regions with optical gain while darkened coupler sections represent regions with loss and high defocusing nonlinearities. Similarly to the operation of the circulator of FIG. 1, a pulse entering port 1 (FIG. 4A) eventually passes through a nonsymmetric, non-Hermitian, coupled waveguide structure. The pulse is first amplified in a semiconductor optical amplifiers (SOA) segment and therefore remains in the same channel of the heavily lossy nonlinear coupler. This is achieved through a substantial detuning in the propagation constants of the two adjacent waveguides involved in the coupling section.

The optical pulse is then subjected to two successive total internal reflections in order to reach a second non-Hermitian, nonlinear directional coupler—identical to that previously encountered. In this second lossy segment, where the pulse is already weak, no change in the refractive index is induced; therefore, the wave will cross-over and hence exit from port 2 after being amplified so as to compensate for all the losses suffered during propagation in this unidirectional circulator structure. Similarly, a pulse from port 2 will reach port 3, and so on. The various fabricated sections of this device are shown in FIGS. 4B-4D. In all cases, we assume a 10 dB amplification stage at the exit ports so as to compensate for the incurred losses.

FIGS. 5A and 5B depict beam propagation simulations for low and high optical intensities, respectively, akin to those encountered in the actual device. The nonlinear switching needed to make this circulator function is clearly evident in FIGS. 5A and 5B.

In the embodied system, p-type contact metals consisting of Ti, Zn and Au were deposited on top of the waveguides so as to operate as semiconductor optical amplifiers (SOAs), thus providing the necessary gain in the gain regions of FIG. 4A. The fully integrated devices were then tested by supplying the SOA with a current of 140 mA. The modal gain coefficient at this current level was measured to be 20 cm$^{-1}$. The input power at each port was then adjusted to reach 1 mW after the coupling losses. The SOA length was prudently designed for a 10 dB gain for each input pulse. In addition, the band filling nonlinear coefficient was measured using a free space Mach-Zehnder interferometer and was found to be 1.5×10$^{-12}$ m$^2$/W. The input pulses (10 ps) were generated through a tunable mode-locked Erbium-doped fiber laser operating at 1550 nm. The waveguide losses in this arrangement were engineered by utilizing bandgap intermixing techniques. This was advantageous in order to avoid excessive losses in the intervening guiding channels. Through this intermixing processes, the bandgap structure of the coupler section remained high as intended (with losses up to 23 cm$^{-1}$), while the remaining regions have been shifted down to 8 cm$^{-1}$. The output light from port 2 (amplified back to 1 mW) was finally imaged on an infrared camera and a fast p-i-n photodiode using a ×20 microscope objective lens. An adjustable slit on a translation stage was placed in front of the photodiode so as to measure the output power from either port independently. Our results indicate that an isolation of 20 dB was obtained in this pulsed circulator in a broadband way around 1550 nm. This is consistent with all the possible transitions (from and to all ports) that unidirectionally take place in a counter-clockwise fashion in this configuration. In all cases, we found that amplified spontaneous emission (ASE), which can be filtered-out, did not have any noticeable effects on the functionality of the device. In principle, by further optimizing the pertaining sections involved, even higher isolation ratios can be achieved.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

We claim:

1. An optical circulator, comprising
a semiconductor substrate;
a plurality of monolithlically-integrated input/output optical waveguides disposed in the substrate;
a respective plurality of optical gain regions in the input/output optical waveguides;
a respective plurality of non-Hermitian coupled waveguide regions disposed in the substrate optically coupled to respective ones of the input/output optical waveguides;
a respective plurality of passive optical waveguides interconnecting the plurality of input/output waveguides disposed in the substrate; and
a respective plurality of beam dumps.

2. The optical circulator of claim 1, comprising an n×n input/output ports optical circulator, where n is equal to or greater than 2.

3. The optical circulator of claim 1, wherein each of the optical gain regions is a semiconductor optical amplifier (SOA).

4. The optical circulator of claim 1, wherein each consecutive input/output port is oriented parallel to its preceding port.

5. The optical circulator of claim 1, wherein the optical waveguides are monomode ridge waveguides.

6. The optical circulator of claim 1, wherein the semiconductor substrate is InP.

7. The optical circulator of claim 6, wherein the optical gain regions comprise an undoped InGaAsP multiple quantum well (MQW) core layer sandwiched between a p-doped InP cladding layer on the top and an n-doped InP cladding layer on the bottom disposed on the InP substrate, a conductive contact stripe disposed over the p-doped InP cladding layer, and a cathode contact layer disposed on the back of the substrate.

8. The optical circulator of claim 7, wherein the MQW regions of the passive optical waveguides have a higher bandgap energy than the MQW regions of other waveguide regions such that the passive optical waveguides are characterized by a low loss propagation.

9. The optical circulator of claim 1, wherein the non-Hermitian coupled waveguide regions comprise two parallelly disposed waveguides separated by a gap, characterized in that for a below threshold optical intensity signal the coupled waveguide region acts as a cross coupler, whereas for an above threshold optical intensity signal the coupled waveguide region behaves as a straight-through connector.

* * * * *

UNITED STATES PATENT AND TRADEMARK OFFICE
CERTIFICATE OF CORRECTION

PATENT NO. : 9,979,160 B2
APPLICATION NO. : 15/627964
DATED : May 22, 2018
INVENTOR(S) : Demetrios Christodoulides et al.

Page 1 of 1

It is certified that error appears in the above-identified patent and that said Letters Patent is hereby corrected as shown below:

On the Title Page

Under (72) Inventors, add the following inventor's name:
--Mercedeh Khajavikhan, Orlando, FL (US)--

Signed and Sealed this
Thirtieth Day of October, 2018

Andrei Iancu
*Director of the United States Patent and Trademark Office*